(12) United States Patent
Parish et al.

(10) Patent No.: US 6,834,712 B2
(45) Date of Patent: Dec. 28, 2004

(54) STACKED LOW PROFILE COOLING SYSTEM AND METHOD FOR MAKING SAME

(75) Inventors: Overton L. Parish, Lubbock, TX (US); Roger S. DeVilbiss, Dallas, TX (US)

(73) Assignee: Thermotek, Inc., Carrollton, TX (US)

( * ) Notice: Subject to any disclaimer, the term of this patent is extended or adjusted under 35 U.S.C. 154(b) by 42 days.

(21) Appl. No.: 10/305,662

(22) Filed: Nov. 26, 2002

(65) Prior Publication Data

US 2003/0136548 A1 Jul. 24, 2003

Related U.S. Application Data

(60) Provisional application No. 60/334,235, filed on Nov. 27, 2001.

(51) Int. Cl.[7] ............................................... F28D 15/00
(52) U.S. Cl. ............................ 165/104.26; 165/104.21; 165/104.33; 361/700; 174/15.2; 257/715
(58) Field of Search ........................ 165/104.21, 104.26, 165/104.33, 80.3, 185; 361/700; 174/15.2; 257/715

(56) References Cited

U.S. PATENT DOCUMENTS

| | | | |
|---|---|---|---|
| 4,345,642 A | * 8/1982 | Ernst et al. ................... | 165/86 |
| 4,381,032 A | 4/1983 | Cutchaw ....................... | 165/80 |
| 4,558,395 A | 12/1985 | Yamada et al. ............... | 361/385 |
| 4,729,060 A | 3/1988 | Yamamoto et al. ........... | 361/385 |
| 4,830,100 A | 5/1989 | Kato et al. ................... | 165/80.4 |
| 4,854,377 A | 8/1989 | Komoto et al. ............... | 165/80.4 |
| 4,880,052 A | * 11/1989 | Meyer et al. .................. | 165/104.14 |
| 4,896,716 A | 1/1990 | Sotani et al. .................. | 165/54 |
| 4,909,315 A | 3/1990 | Nelson et al. ................. | 165/80.3 |
| 4,982,274 A | 1/1991 | Murase et al. ................ | 357/82 |
| 5,036,384 A | 7/1991 | Umezawa ..................... | 357/82 |
| 5,054,296 A | 10/1991 | Sotani et al. .................. | 62/259.1 |
| 5,084,966 A | 2/1992 | Murase ......................... | 29/890.043 |
| 5,159,529 A | 10/1992 | Lovgren et al. ............... | 361/385 |
| 5,186,252 A | 2/1993 | Nishizawa et al. ........... | 165/181 |
| 5,283,464 A | 2/1994 | Murase .......................... | 257/714 |

(List continued on next page.)

FOREIGN PATENT DOCUMENTS

| | | | |
|---|---|---|---|
| JP | 53-136749 | 11/1978 | |
| JP | 2002-206881 | * 7/2002 | ............ 165/104.26 |
| WO | WO 98/02060 | 1/1998 | |
| WO | WO 99/42781 | 8/1999 | |
| WO | WO 00/70288 | 11/2000 | |
| WO | WO 01/03484 A1 | 1/2001 | |

OTHER PUBLICATIONS

Andre Ali; Robert DeHoff; and Kevin Grubb; "*Advanced Heat Pipe Thermal Solutions For Higher Power Notebook Computers*"; Intel Corporation, Santa Clara, CA, 1999; Thermacore, Inc. Lancaster, PA 1999; 6 pages.

Thermalex, Inc.; "*Setting A Higher Standard In Aluminum Extrusions*"; Brochure undated; 8 pages.

"*Furukawa Electric Heat Planar*"; Brochure undated from Trade Show, Aug. 1999; 4 pages.

*Primary Examiner*—Terrell McKinnon
(74) *Attorney, Agent, or Firm*—Jenkens & Gilchrist, P.C.

(57) ABSTRACT

A stacked array of low profile heat pipes each with a plurality of micro tubes extended therethrough. The stacked low profile heat pipes are placed into thermal connection with heat producing components. A heat transfer fluid is contained in the micro tubes of the low profile heat pipes and removes the heat from the heat producing components.

58 Claims, 13 Drawing Sheets

U.S. PATENT DOCUMENTS

| | | | |
|---|---|---|---|
| 5,283,715 A * | 2/1994 | Carlsten et al. | 361/702 |
| 5,285,347 A | 2/1994 | Fox et al. | 361/385 |
| 5,342,189 A | 8/1994 | Inamura et al. | 425/461 |
| 5,353,639 A | 10/1994 | Brookins et al. | 72/363 |
| 5,388,635 A | 2/1995 | Gruber et al. | 165/80.4 |
| 5,409,055 A | 4/1995 | Tanaka et al. | 165/104.33 |
| 5,535,816 A | 7/1996 | Ishida | 165/80.3 |
| 5,555,622 A | 9/1996 | Yamamoto et al. | 29/890.053 |
| 5,567,493 A | 10/1996 | Imai et al. | 428/36.9 |
| 5,598,632 A | 2/1997 | Camarda et al. | 29/890.032 |
| 5,615,086 A | 3/1997 | Collins et al. | 361/704 |
| 5,660,229 A | 8/1997 | Lee et al. | 165/104.26 |
| 5,682,748 A | 11/1997 | DeVilbiss et al. | 62/3.7 |
| 5,689,957 A | 11/1997 | DeVilbiss et al. | 62/3.7 |
| 5,690,849 A | 11/1997 | DeVilbiss et al. | 219/497 |
| 5,697,428 A * | 12/1997 | Akachi | 165/104.21 |
| 5,711,155 A | 1/1998 | DeVilbiss et al. | 62/3.7 |
| 5,890,371 A | 4/1999 | Rajasubramanian et al. | 62/259.2 |
| 5,901,037 A | 5/1999 | Hamilton et al. | 361/699 |
| 5,901,040 A | 5/1999 | Cromwell et al. | 361/704 |
| 5,960,866 A | 10/1999 | Kimura et al. | 165/104.33 |
| 5,989,285 A | 11/1999 | DeVilbiss et al. | 607/107 |
| 6,032,726 A | 3/2000 | Wright et al. | 165/109.1 |
| 6,058,712 A | 5/2000 | Rajasubramanian et al. | 62/3.6 |
| 6,072,697 A | 6/2000 | Garcia-Ortiz | 361/704 |
| 6,148,906 A * | 11/2000 | Li et al. | 165/104.33 |
| 6,462,949 B1 | 10/2002 | Parish, IV et al. | 361/699 |
| 6,679,316 B1 * | 1/2004 | Lin et al. | 165/104.26 |
| 2002/0189793 A1 * | 12/2002 | Noda et al. | 165/104.26 |

* cited by examiner

STACKED LOW PROFILE COOLING SYSTEM AND METHOD FOR MAKING SAME

CROSS REFERENCES TO RELATED APPLICATIONS

This U.S. Patent Application incorporates herein by reference, and claims priority from U.S. Provisional Application No. 60/334,235 filed Nov. 27, 2001.

BACKGROUND OF THE INVENTION

1. Field of the Invention

The present invention pertains to a cooling apparatus, and more particularly, but not by way of limitation, to a cooling apparatus using stacked low profile extrusions (LPE's).

2. History of Related Art

As is explained in greater detail hereinbelow, LPE cooling devices are extremely useful in printed circuit board (PCB) level cooling of electronic components, and for use as heat exchangers in applications where space is limited and/or low weight is critical.

LPE refers to a heat exchange apparatus comprising an integral piece of metal having a series of micro extruded hollow tubes formed therein for containing a fluid. LPE's preferably have multi-void micro extruded tubes designed to operate under the pressures and temperatures required by modern environmentally safe refrigeration gases and to resist corrosion. Aspects of the LPE application to the present invention are set forth and shown in co-pending U.S. patent application Ser. No. 09/328,183 assigned to the assignee of the present invention and incorporated herein by reference.

Low profile extrusions can currently be manufactured with a profile, or height, as low as about 0.05 inches and with tubes of varying inner diameters. Of course, future advances may allow such low profile extrusions to be manufactured with an even smaller profile. Such low profile extrusions have been conventionally used in heat exchanger applications in the automotive industry, and are commercially available in strip form (having a generally rectangular geometry) or coil form (a continuous strip coiled for efficient transport).

An example low profile extrusions is described in a brochure entitled "Thermalex, Inc.—Setting A Higher Standard in Aluminum Extrusions" (hereinafter the "Thermalex Brochure") provides additional detail regarding the Thermalex low profile extrusions and is incorporated herein by reference.

U.S. Pat. No. 5,342,189 to Inamura, et al, which is incorporated herein by reference, provides additional detail regarding an extrusion die for making such low profile extrusions. The extrusion die is used for making multi-cavity flat aluminum tubes, which are used for small heat exchanger components, in automotive air-conditioners, condensers, and radiators. The insert die is composed of a male die section having a protrusion part and a female die section, having a die cavity, and is held detachably in a die holder. The male section is a roughly rectangular plate-shaped component, and has an integrally formed twist prevention region which is inserted into the receiver groove of the female section which is integrally formed thereon. The protrusion part defines the cavity shape of the multi-cavity flat tube, and the female section has the die cavity of the required cross sectional shape to define the outer shape of the tube.

U.S. Pat. No. 5,353,639 to Brookins, et al, which is incorporated herein by reference, provides additional detail regarding a method and apparatus for sizing a plurality of micro extruded tubes used in such low profile extrusions. As described by the Brookins patent, a predetermined number of micro extruded tubes are stacked on the base fence between the fixed side fence and the clamping fence. The internal webs of the tubes are aligned throughout the stack, perpendicular to the plane of the base fence. The clamping fence is moved toward the stack of tubes to prevent the stack from moving laterally. The die platen is moved toward the stack of tubes and the mating surface of the die platen is in mating engagement with a side surface of the uppermost tube in the stack. A predetermined amount of pressure is applied to the stack of tubes through the die platen. The pressure is applied equally across the entire side surface of the uppermost tube and is transmitted equally through all the tubes of the stack in the sizing die.

Other developments in cooling apparatus may be seen in U.S. Pat. No. 5,285,347 to Fox et al., which describes a hybrid cooling system for electrical components. A hybrid heat sink is specially adapted to transfer heat to two cooling fluids. This heat sink is incorporated into a cooling system in which some of the electronic components of an electronic device may be cooled by two cooling fluids and some electronic components may be cooled by one cooling fluid. The electronic components are mounted on a circuit board. In the Fox reference, one of the cooling fluids is air and one is a liquid. The hybrid heat sink is attached to electronic components that cannot be cooled to the normal operating range by the cooling air alone. The cooling air is caused to flow over the surface of the heat sink, removing some of the heat. In addition, the cooling liquid is caused to flow through the heat sink, thereby removing additional heat.

In addition, U.S. Pat. No. 5,901,037 to Hamilton, et al. describes a system for closed loop liquid cooling for semiconductor RF amplifier modules. The system comprises a combination of a plurality of elongated microchannels connected between a pair of coolant manifolds for conducting liquid coolant beneath the transistors to dissipate the heat generated thereby. The system also includes a heat exchanger, a miniature circulating pump located on the module, and passive check valves having tapered passages for controlling the flow of coolant in the loop. The valve comprises a truncated pyramid-shaped microchannel valve having no moving parts and is fabricated so as to be a part of either the circulating pump assembly, the coolant manifold, or the microchannels.

SUMMARY OF THE INVENTION

The present invetnion relates to a low profile extrusion cooling method and apparatus. More particularly, the present invention relates to a stacked low profile phase plane heat pipe cooling system and method. In one aspect, the invention includes stacked, low profile phase plane heat pipes, wherein heat transfer fluids contained therein are induced to flow by heat absorbed thereby. The stacked, low profile cooling system of the present invention includes a first low profile extrusion. Stacked on top of the first phase plane heat pipe is a second low profile phase plane heat pipe also in thermal contact with the first phase plane heat pipe. A third low profile phase plane heat pipe may be stacked on top of the first and second low profile phase plane heat pipes. The third low profile phase plane heat pipe is in thermal contact with a top surface of the first low profile phase plane heat pipe.

In another embodiment, a first, second and an optional third thermally conductive spacer block are provided on the undersurface of each low profile phase plane heat pipe and are in thermal contact therewith. The first, second, and optional third thermally conductive spacer blocks provide a conduit for heat transfer from the heat source up to and through the stacked, low profile cooling system.

In yet another embodiment, cooling fins are provided on the undersurface and topsurface of the low profile phase plane heat pipes. The cooling fins include elongated arrays in thermal contact with the phase plane heat pipes.

In still another embodiment, the low profile phase plane heat pipes are low profile phase plane heat pipes (heat pipes). The low profile phase plane heat pipes are preferably positioned at an angle between 0 and 90 degrees extending laterally from an element which may be either a heat source or the thermally conductive spacer block. The angle further facilitates the movement of evaporated fluid into the extremities of the heat pipes for the condensation thereof and the flow of fluid back into evaporator sections where additional heat may be absorbed.

The present invention pertains to an improved, high volume, stacked LPE apparatus and method for manufacturing thereof.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION

The preferred embodiments of low profile extrusions of an unstacked variety and their advantages are best understood by referring to FIGS. 1–8 of the drawings, like numerals being used for like and corresponding parts of the various drawings. The heat exchange apparatus of an unstacked variety is illustrated in FIGS. 1–8 by example, and various modifications may be made by a person of ordinary skill in the art. The preferred embodiments of the present invention are best understood by referring to FIGS. 9–14 of the drawings.

Figure 1:
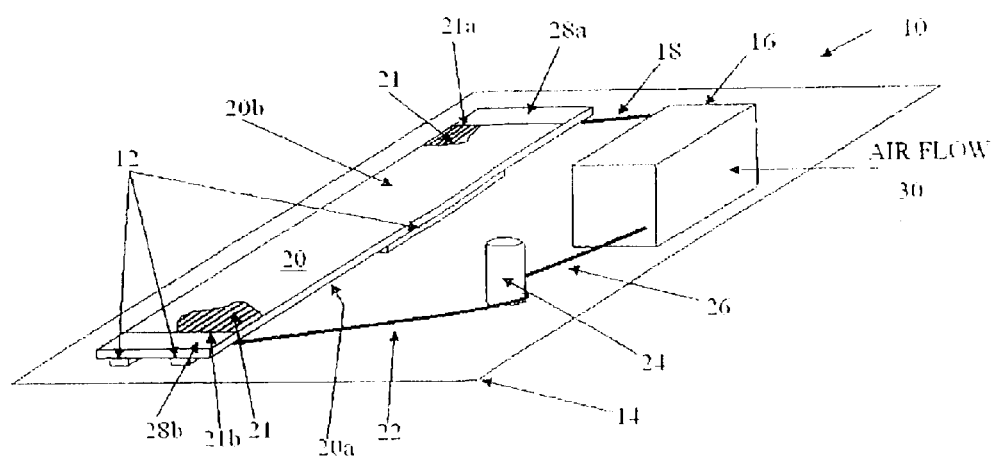
FIG. 1 is a schematic illustration of a low profile extrusion heat exchange apparatus of an unstacked variety, shown as a circulation cooling apparatus for removal of heat from certain heat generating components.

Referring first to FIG. 1, there is shown a schematic illustration of a first preferred embodiment of a heat exchange apparatus of an unstacked variety showing a cooling apparatus 10 used for removing heat from certain heat generating components 12 mounted on a printed circuit board 14. The printed circuit board 14 may be housed in a host electronic device (not shown) such as computer, a laptop or notebook computer, or other electronic equipment. Due to the ongoing miniaturization of such host electronic devices, the heat generating components 12 are often located in an area of the printed circuit board 14 and of the host electronic device where space is extremely limited, especially in the "z", or height dimension.

Referring still to FIG. 1, the cooling apparatus 10 generally includes a conventional liquid-to-air heat exchanger 16, an inlet tube 18, a low profile extrusion 20, an outlet tube 22, a conventional pump 24, and tubing 26. The low profile extrusion 20 has a plurality of micro tubes 21, each micro tube 21 having a micro tube inlet 21a and a micro tube outlet 21b. The extrusion 20 is preferably formed with a flat surface on its bottom side 20a for contacting heat generating components 12, and may be formed with external fins (not shown) on its top side 20b to maximize heat transfer, if space allows. The extrusion 20 is also preferably formed with at least one solid channel (not shown) for mounting to the printed circuit board 14. Conventional thermal interface material (not shown) is preferably provided between the low profile extrusion 20 and heat generating components 12.

Still referring to FIG. 1, the micro tube inlets 21a of the micro tubes 21 in the extrusion 20 are interconnected in fluid communication, and are also connected to the inlet tube 18, by an inlet end cap 28a. Similarly, the micro tube outlets 21b of the micro tubes 21 in the extrusion 20 are interconnected in fluid communication, and are also connected to the outlet tube 22, by an outlet end cap 28b. The heat exchanger 16 may contain a fluid reservoir (not shown) therein for housing a fluid such as water, glycol, alcohol, or other conventional refrigerants. In this case, fluid from the heat exchanger 16 is circulated through the inlet tube 18, the low profile extrusion 20, the outlet tube 22, and the tubing 26 via the pump 24. Alternatively, the entire cooling apparatus 10 may be evacuated and charged with fluid which is then circulated via the pump 24.

Referring still to FIG. 1, during operation of the host electronic device, heat generated by heat generating components 12 is transferred from heat generating components 12 to low profile extrusion 20, to the fluid circulating within low profile extrusion 20, and then to heat exchanger 16. Heat exchanger 16 removes the heat from the fluid in a conventional manner. Preferably, an airflow 30 is passed over heat exchanger 16 to aid in such heat removal. Cooling apparatus 10 thus efficiently removes heat from a limited space, low profile area within the host electronic device (the location of low profile extrusion 20) to an area where it can be removed at a more convenient location and envelope (the location of heat exchanger 16).

Figure 2:
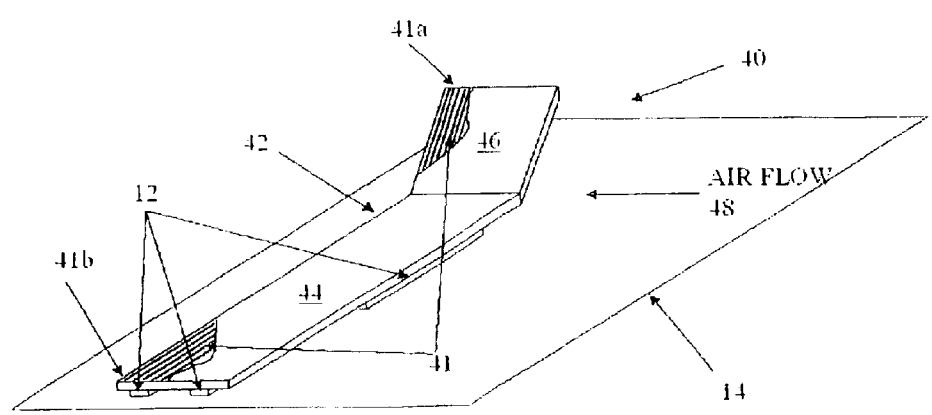
FIGS. 2 and 3 are schematic illustrations of another embodiment of the low profile extrusion heat exchange apparatus of an unstacked variety, shown as the heat pipe type cooling apparatus for removal of heat from certain heat generating components.
Figure 3:
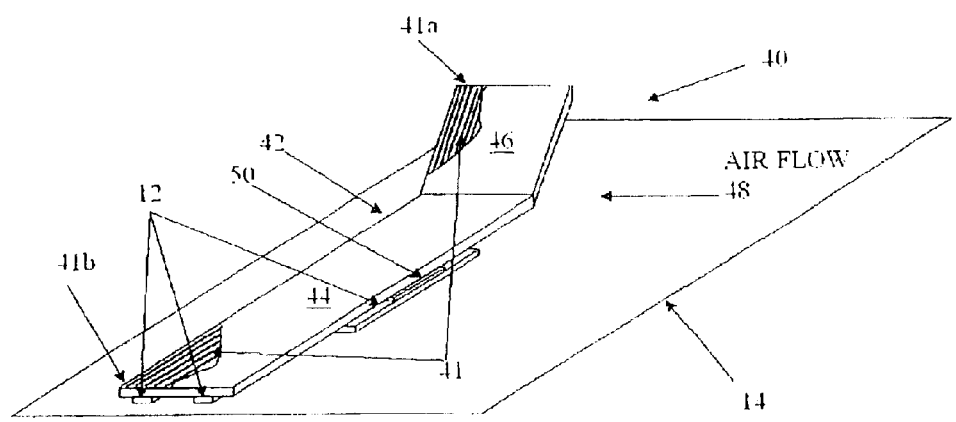

Referring now to FIGS. 2 and 3 in combination, there are shown schematic illustrations of a second preferred embodiment of a low profile cooling system of an unstacked variety showing a cooling apparatus 40 used for removing heat from heat generating components 12 on printed circuit board 14.

Referring first to FIG. 2, there is shown the cooling apparatus 40 generally comprising a low profile extrusion 42 manufactured as a heat pipe capable of phase change heat transfer. A preferred method of making a low profile heat pipe extrusion 42 is described in greater detail hereinbelow. The low profile heat pipe extrusion 42 is preferably formed with micro tubes 41, each micro tube 41 having a conventional wick structure such as internal fins, grooved inner sidewalls, or metal screens, so as to maximize their heat transfer capability via capillary action. To form a heat pipe, the micro tubes 41 of the low profile heat pipe extrusion 42 are evacuated and then charged with a fluid such as water, glycol, alcohol, or other conventional refrigerants before sealing the ends 41a and 41b of the micro tubes 41. As is known in the art, a heat pipe generally has an effective thermal conductivity of several multiples higher than that of a solid rod. This increase in efficiency is due to the fact that the phase change heat transfer coefficients are high compared to the thermal conductivity of conventional materials.

Referring still to FIG. 2, the low profile heat pipe extrusion 42 is preferably formed into a first portion 44 for contacting heat generating components 12 and a raised second portion 46. First portion 44 and second portion 46 are preferably substantially similar in construction to low profile extrusion 20 of FIG. 1, except end caps 28 are not required. First portion 44 acts as the evaporator section of the heat pipe, and second portion 46 acts as the condenser section of the heat pipe.

Still referring to FIG. 2, during operation of the host electronic device, heat generated by heat generating components 12 is transferred from heat generating components 12 to first portion 44. This heat causes the liquid within the micro tubes 41 in first portion 44 to change to vapor, consuming some of the generated heat. Because the vapor is less dense than the surrounding liquid, the vapor and associated heat rise into the micro tubes 41 in second portion 46. Of course, heated liquid may also be transferred from first portion 44 to second portion 46 via the capillary action of the wick structures of the micro extruded tubes therein. In second portion 46, the vapor condenses into liquid onto the inner side walls of the micro extruded tubes 41. The heat generated by the condensation reaction, as well as any heat transferred via capillary action of the wick structure, is then transferred to air flow 48. Cooling apparatus 40 thus efficiently removes heat from a limited space, low profile area within the host electronic device (the location of first portion 44) to an area where it can be removed at a more convenient location and envelope (the location of second portion 46). Of course, if low profile heat pipe extrusion 42 is formed with internal wick structures, it is not necessary that second portion 44 be raised from, or higher than, first portion 42.

Referring now to FIG. 3, low profile heat pipe extrusion 42 is shown in operation with a conventional thermoelectric cooler (TEC) 50 in contact with one of the heat generating components 12. A preferred TEC is sold by Marlow Industries, Inc. of Dallas, Tex. TEC 50 facilitates the heat transfer between the heat generating component 12 and first portion 44 of low profile heat pipe extrusion 42, and thus is preferred for use with heat generating components 12 that have high power densities.

Figure 4:
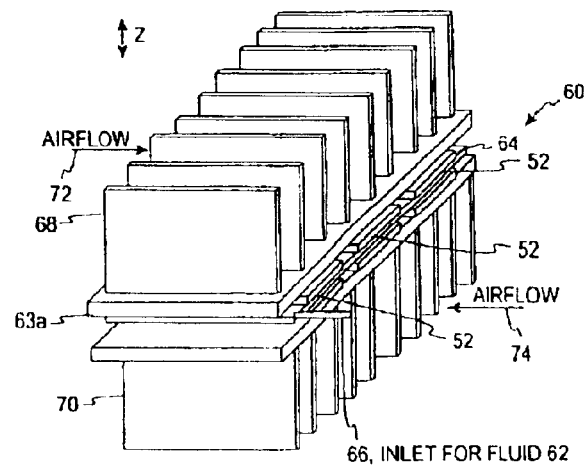
FIG. 4 is a schematic illustration of another embodiment of the low profile extrusion heat exchange apparatus of an unstacked variety, shown as heat transfer component of a recirculatory system.

Referring now to FIG. 4, there is shown a schematic illustration of a third preferred embodiment of a low profile cooling system of an unstacked variety showing a cooling apparatus 60 used for removing heat from a fluid 62, such as water, glycol, alcohol, or other conventional refrigerants. Fluid 62 is then used to cool conventional heat generating components, such as heat generating components 12 of printed circuit board 14, as shown in FIGS. 1–3. By way of example, cooling apparatus 60 may be used in place of conventional heat exchanger 16 in FIG. 1.

Referring still to FIG. 4, the cooling apparatus 60 generally comprises a low profile extrusion 64, an inlet end cap 63a, an inlet tube 66, an outlet end cap (not shown), an outlet tube (not shown), thermoelectric coolers 52, and conventional bonded fin heat sinks 68 and 70. The low profile extrusion 64 is preferably substantially similar in construction to low profile extrusion 20 of FIG. 1, with a plurality of micro tubes (not shown) having a micro tube inlet and a micro tube outlet (not shown). The micro tube inlets of the micro tubes in the extrusion 64 are interconnected in fluid communication, and to the inlet tube 66, by the inlet end cap 63a. Similarly, the micro tube outlets of the micro tubes in the extrusion 64 are interconnected in fluid communication, and to the outlet tube, by an outlet end cap.

Still referring to FIG. 4, the low profile extrusion 64 preferably has generally flat bottom and top surfaces for contact with thermoelectric coolers (TEC) 52. The conventional bonded fin heat sink 68 is coupled to TECs 52 on the top surface of low profile extrusion 64, and the conventional bonded fin heat sink 70 is coupled to TECs 52 on the bottom surface of low profile extrusion 64.

Referring still to FIG. 4, in operation, the low profile extrusion 64 serves as a manifold, and the TECs 52 remove heat from fluid 62 flowing through the micro tubes of the low profile extrusion 64. This removed heat is transferred from TECs 52 to bonded fin heat sinks 68 and 70, which dissipate the heat to atmosphere in a conventional manner. Preferably, airflows 72 and 74 pass over and through heat sinks 68 and 70 to facilitate such heat dissipation.

Still referring to FIG. 4, the low profile extrusion 64 has a smaller size and mass than conventional heat exchanger manifolds. For example, a conventional manifold has a minimum profile, or height, in the "z" direction of about 0.75 inches, and low profile extrusion 64 may have a profile as low as about 0.1 inches. The reduced mass of low profile extrusion 64 is believed to produce a cooling apparatus 60 with a near zero time constant, increasing startup performance and temperature control. Therefore, cooling apparatus 60 is especially advantageous in applications involving lasers. The wavelength of a laser beam, and thus beam properties, is strongly influenced by temperature, and the tighter temperature control believed to be provided by cooling apparatus 60 is extremely beneficial.

Figure 5A:
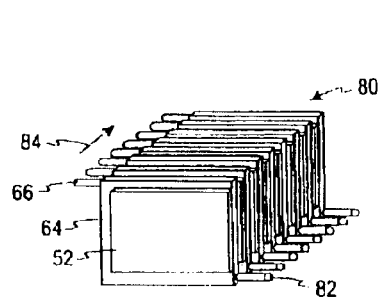
FIG. 5A is a schematic illustration of another embodiment of the low profile extrusion heat exchange apparatus of an unstacked variety, shown as a liquid to liquid manifold cooling apparatus.
Figure 5B:
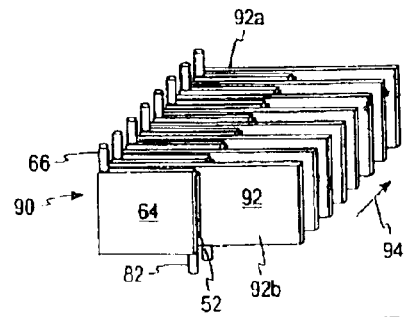
FIG. 5B is a schematic illustration of another embodiment of the low profile extrusion heat exchange apparatus of an unstacked variety, shown as a liquid to air manifold cooling apparatus.
Figure 5C:
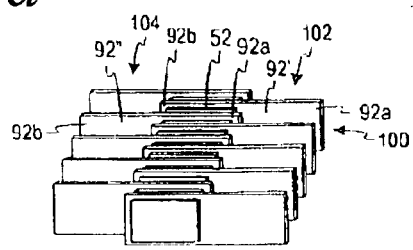
FIG. 5C is a schematic illustration of another embodiment of the low profile extrusion heat exchange apparatus of an unstacked variety, shown as an air to air manifold cooling apparatus.

Referring now to FIGS. 5A, 5B, and 5C in combination, there are shown schematic illustrations of a fourth, fifth, and sixth preferred embodiment of a low profile cooling system of an unstacked variety.

Referring first to FIG. 5A, there is shown a cooling apparatus 80 having a plurality of low profile extrusions 64 and TECs 52 arranged in a serial fashion. A TEC 52 is disposed between, and is in contact with, each of the extrusions 64. Only one low profile extrusion 64 and one TEC 52 is numbered in FIG. 5A for clarity of illustration. Fluid 62 enters each extrusion 64 via inlet 66 and exits each extrusion 64 via an outlet 82. In operation, TECs 52 remove heat from fluid 62 flowing through low profile extrusions 64. This removed heat is transferred to airflow 84 passing over cooling apparatus 80.

Referring now to FIG. 5B, there is shown a cooling apparatus 90 having a plurality of low profile extrusions 64, TECs 52, and low profile heat pipe extrusions 92 arranged in a serial fashion. More specifically, a TEC 52 is disposed between, and is in contact with, each low profile extrusion 64 and low profile heat pipe extrusion 92. Only one low profile extrusion 64, one TEC 52, and one low profile heat pipe extrusion 92 are numbered in FIG. 5B for clarity of illustration. Each low profile heat pipe extrusion 92 is preferably substantially similar in construction to low profile heat pipe extrusion 42 of FIG. 1, excluding raised portion 46. Fluid 62 enters each extrusion 64 via inlet 66 and exits each extrusion 64 via outlet 82. In operation, each TEC 52 removes heat from fluid 62 flowing through an adjacent low profile extrusion 64. This removed heat is transferred to the evaporator portion 92a of the adjacent low profile heat pipe extrusion 92. The heat is then transferred to the condenser portion 92b of the low profile heat pipe extrusion 92, as is explained hereinabove in connection with low profile heat pipe extrusion 42 of FIGS. 2 and 3. An airflow 84 passing over cooling apparatus 90 dissipates heat from each condenser portion 92b of each low profile heat pipe extrusion 92.

Referring next to FIG. 5C, there is shown a cooling apparatus 100 having a plurality of TECs 52 and low profile heat pipe extrusions 92 arranged in a serial fashion. More specifically, a TEC 52 is disposed between, and is in contact with, each low profile heat pipe extrusion 92, and the "free end" of adjacent low profile heat pipe extrusions 92 extend in opposite directions. Only one TEC 52 and two low profile heat pipe extrusions, 92' and 92", are numbered in FIG. 5C for clarity of illustration. In operation, a hot airflow 102 flows over each evaporator portion 92a of low profile heat pipe extrusions 92'. This heat is transferred from evaporator portion 92a to condenser portion 92b of extrusion 92', as is explained hereinabove in connection with low profile heat pipe extrusion 42 of FIGS. 2 and 3. Condenser portion 92b of extrusion 92' is in contact with TEC 52. The TEC 52 removes heat from condenser portion 92b of extrusion 92' and transfers it to evaporator portion 92a of low profile heat pipe extrusion 92". This heat is then transferred from evaporator portion 92a to condenser portion 92b of extrusion 92". Cold airflow 104 passing over condenser portions 92b of each extrusion 92" dissipates heat from cooling apparatus 100.

Referring again to FIGS. 5A–5C in combination, cooling apparatus 80, 90, and 100 have the same applications and advantages of cooling apparatus 60 described hereinabove.

As will be appreciated by one skilled in the art, cooling apparatus 60, 80, and 90 may also be operated as heating apparatus by using thermoelectric coolers (TECs) 52 to heat, rather than to cool, a fluid.

Figure 6:
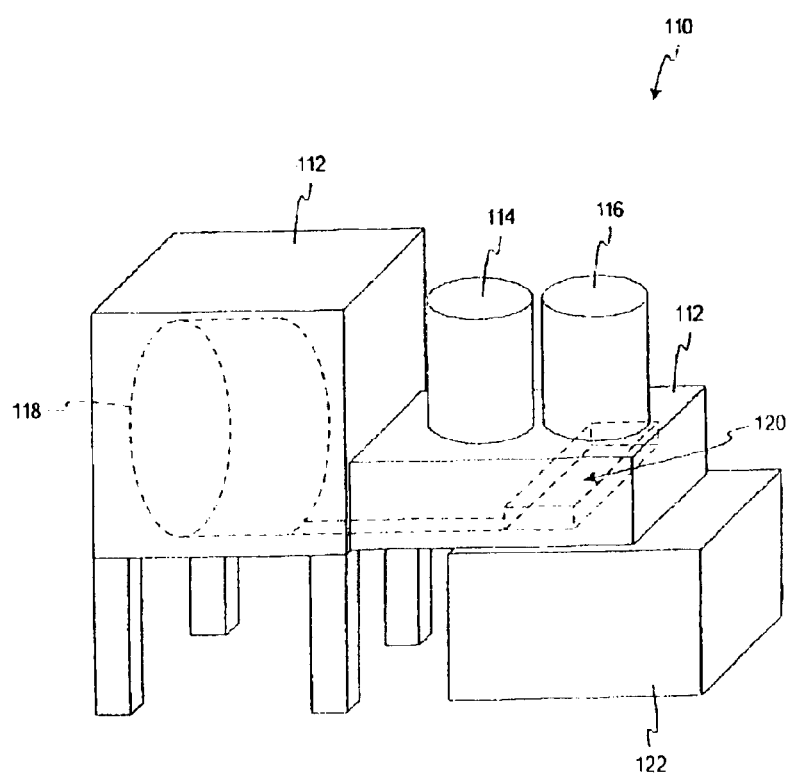
FIG. 6 is a is a schematic illustration of a method and apparatus for manufacturing heat pipes according to an embodiment of the heat exchange apparatus of an unstacked variety.

Referring now to FIG. 6, there is shown a schematic illustration of a method and apparatus for manufacturing heat pipes according to a seventh preferred embodiment of a low profile cooling system of an unstacked variety. As noted hereinabove, the preferred apparatus and method may be utilized to make low profile heat pipe extrusions 42 and 92 of FIGS. 2, 3, 5B, and 5C. However, the preferred apparatus and method may also be utilized to make extruded hollow tubes for other heat exchangers and heat pipes.

Referring still to FIG. 6, apparatus 110 generally includes an oven 112 having a sealable housing. A vacuum station 114 and a fluid charging station 116 are in fluid communication with oven 112. A coil 118 is disposed within a portion of oven 112 on a conventional automatic feed system. Coil 118 may be a coil of hollow tubing, a coil of low profile extrusion, or a coil of other conventional extrusion having a series of extruded hollow tubes therein. An ultrasonic welder/sealer is also disposed in oven 112. A preferred ultrasonic welder/sealer is the Ultraseal® series sold by American Technology, Inc. of Shelton, Conn. A brochure entitled "Ultraseal®-20 20 kHz Portable Ultrasonic Metal Tube Sealer" (hereinafter the "Amtech Brochure") provides additional information regarding the Ultraseal® series of ultrasonic welder/sealers and is incorporated herein by reference.

In a conventional process, the first step is actually forming and cutting the heat exchanger, heat pipe, or extruded tubes into the desired configuration. Next, this preformed system is evacuated and charged with a fluid such as water, glycol, alcohol, or other conventional refrigerants. The system is then sealed, completing the process. Conventional processes are expensive because they are labor intensive and require long setup times for different configurations of heat exchangers, heat pipes, or extruded tubes.

Referring to FIG. 6, apparatus 110 may be used, however, to efficiently and economically produce heat exchangers, heat pipes, and extruded tubes, including low profile extrusions, according to the following preferred process. First, coil 118 is placed within oven 112 on the automatic feed system. Second, coil 118 is evacuated using vacuum station 114. Preferably, coil 118 is pulled down to a vacuum of about $10^{-7}$ torr for a period of approximately twenty four hours. Third, coil 118 is charged with a known amount of fluid, such as water, glycol, alcohol, or other conventional refrigerants, using charging station 116. Fourth, oven 112 heats coil 118 until all of the fluid is in the vapor phase, and the vapor fills the interior of coil 118 evenly. Fifth, using the automatic feed system, the heated and charged coil 118 is reeled out, and is crimped, sealed, and cut into desired lengths using ultrasonic welder/sealer 120. When forming tube heat pipes, ultrasonic welder/sealer 120 preferably canoe crimps the extrusions. Finished product is collected within bucket 122. In this manner, heat exchangers, heat pipes, and extruded tubes, including low profile extrusions, are formed while charged with fluid, significantly reducing the setup time and vacuum expense over conventional processes.

Figure 7:
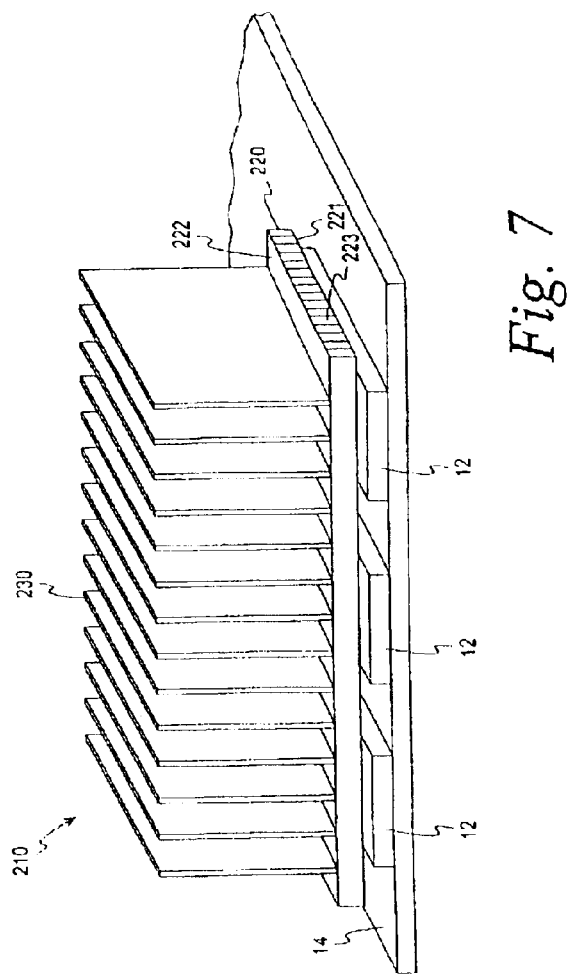
FIG. 7 is a schematic illustration of another embodiment of the low profile extrusion heat exchange apparatus of an unstacked variety, shown as heat pipe base/fin cooling apparatus.

Referring now to FIG. 7, there is shown an illustration of another embodiment of a low profile cooling system of an unstacked variety. A cooling apparatus 210 is used for removing heat from heat generating components 12 on a printed circuit board 14. The cooling apparatus 210 comprises a low profile extrusion 220 manufactured as a heat pipe capable of phase change heat transfer. The low profile heat pipe extrusion 220 is formed having a plurality of micro tubes 223, preferably having therein a conventional wick structure such as internal fins, grooved inner side walls, or metal screens, so as to maximize the heat transfer capability via capillary action. The micro tubes 223 of the low profile heat pipe extrusion 220 are evacuated and then charged with a fluid such as water, glycol, alcohol, or other conventional refrigerants, before the ends of the micro tubes are sealed.

Referring still to FIG. 7, the low profile heat pipe extrusion 220 has a first surface 221 for engaging the heat generating components 12 and receiving heat therefrom. On a second surface 222 of the low profile extrusion 220, a conventional bonded fin heat sink 230 or a plurality of cooling fins are mounted to the low profile extrusion 220. Preferably, the micro tubes 223 are disposed in a direction perpendicular to the fins 230 for transferring heat between each of the individual fins 230. The heat transfer between the individual fins 230 promotes an even distribution of heat across each of the fins 230. However, the micro tubes 223 can be oriented for the transfer of heat along the length of the fins 230. Additionally, in one embodiment, the micro tubes 223 of the low profile extrusion 220 are oriented for disbursing heat from the heat generating components 12 to areas of the low profile extrusion 220 which are not in contact with the heat generating components 12.

Still referring to FIG. 7, the use of the low profile extrusion 220 for transferring heat in the cooling apparatus 210 increases the effective surface area that is transferring heat from the heat generating components to the cooling fins 230. The resulting cooling apparatus is therefore smaller in size and lighter in weight for the same effective cooling attributes. In some embodiments, the low profile cooling system of an unstacked variety can decrease the weight of an apparatus for cooling a heat generating component by as much as 50% over traditional fins mounted via a metal plate.

Figure 8:
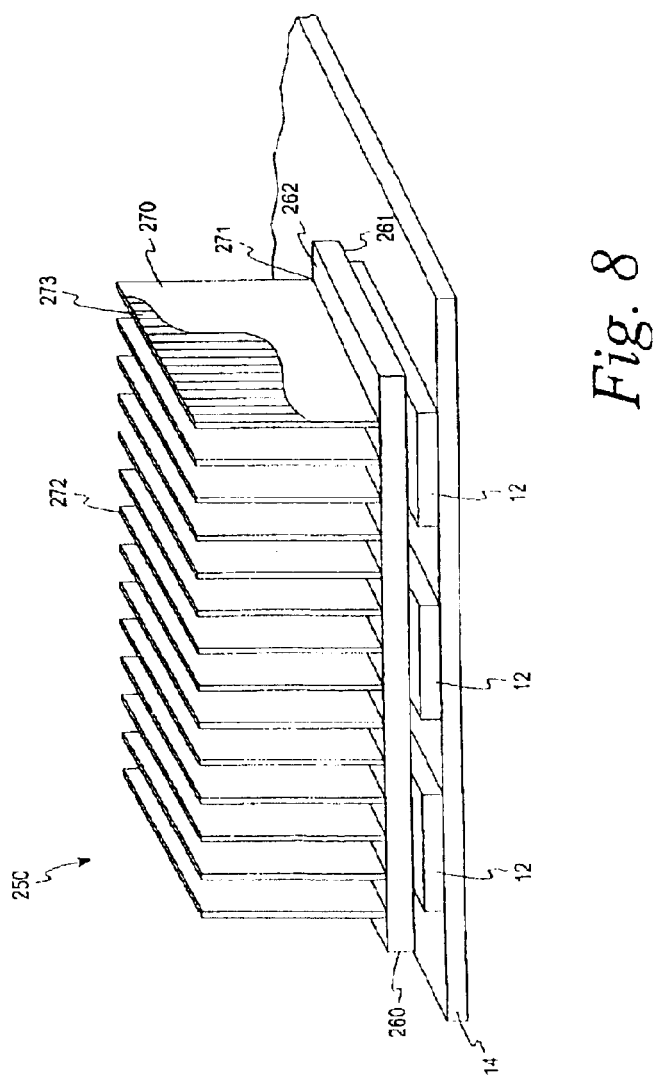
FIG. 8 is a schematic illustration of another embodiment of the low profile extrusion heat exchange apparatus of an unstacked variety, shown as a base/heat pipe fin cooling apparatus.

Referring now to FIG. 8, there is shown an illustration of another embodiment of a low profile cooling system of an unstacked variety, showing a cooling apparatus 250 used for removing heat from heat generating components 12 on printed circuit board 14. The cooling apparatus generally comprises a base 260 and a plurality of low profile extrusion fins 270. The base 260 has a first side 261 for transferring heat between the cooling apparatus 250 and heat generating components 12. The base 260 also has a second surface 262 for mounting the low profile extrusion fins 270.

Referring still to FIG. 8, the low profile extrusion fins 270 are low profile extrusions manufactured as a heat pipe capable of phase change heat transfer. The low profile extrusion fins 270 are preferably formed with a plurality of micro tubes 273, each internally having a conventional wick structure such as fins, grooved side walls, or metal screens, so as to maximize the heat transfer capability via capillary action. The micro tubes 273 of the low profile extrusion heat piping 270 are evacuated and then charged with a fluid such as water, glycol, alcohol, or other conventional refrigerants, before the micro tubes 273 are sealed.

Still referring to FIG. 8, a first end 271 of the low profile extrusion fins 270 is mounted to the second surface 262 of the base 260 with a second end 272 extending outwardly therefrom. The plurality of low profile extrusion fins 270 are preferably mounted in rows for convection heat transfer to the surrounding environment. In one embodiment, the base 260 can also be formed from a low profile extrusion similar to the low profile extrusion 220 in FIG. 7.

Referring still to FIG. 8, the use of the heat pipe type low profile extrusion fins 270 in the cooling apparatus 250 increases the effective surface area in which heat is transferred from the heat generating components to the surrounding environment via the base 260. The resulting cooling apparatus is therefore smaller in size and lighter in weight for the same effective cooling attributes.

Figure 9:
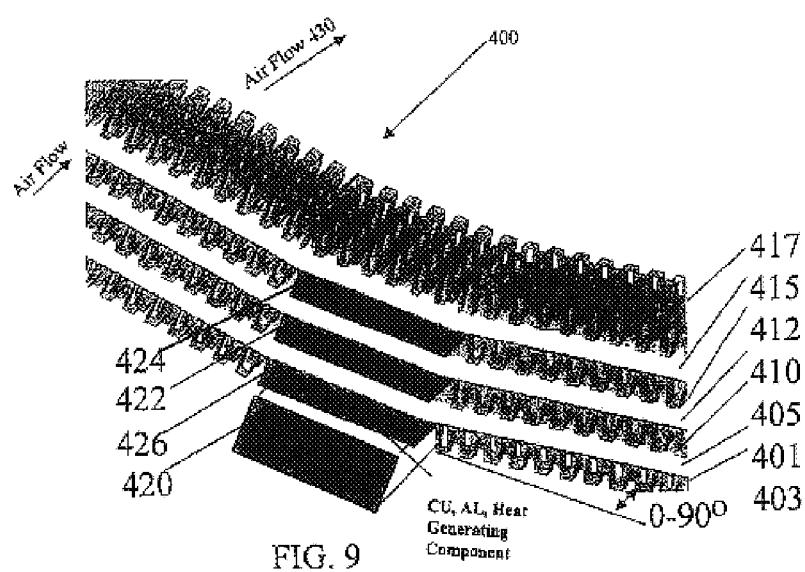
FIG. 9 is an illustration of one aspect of a stacked low profile cooling system constructed in accordance with the principles of the present invention.

Referring now to FIG. 9, there is shown an illustration of a stacked, low profile cooling system 400 of the present invention, with an array of cooling fins secured to an assembly of the low profile extrusion heat pipes described above. More specifically, the stacked, low profile cooling system 400 includes a first phase plane heat pipe 401 with fins 403 secured to an undersurface thereof, and fins 405 secured to a top surface thereof. Stacked on top of the phase plane heat pipe 401 is a second phase plane heat pipe 410, also in thermal contact with the cooling fins 405 disposed on the underside thereof, and further having a set of cooling fins 412 disposed on a top surface thereof. A first thermally conductive spacer block 422 is disposed between the first phase plane heat pipe 401 and the second phase plane heat pipe 410. A third phase plane heat pipe 415 is stacked on top of the first and second phase plane heat pipes 401 and 410 also in thermal contact with the cooling fins 412 and further being assembled with cooling fins 417 stacked on a top surface thereof. Similarly, a second thermally conductive spacer block 424 is disposed between the second phase plane heat pipe 410 and the third phase plane heat pipe 415. It may be seen that the cooling fins 403, 405, 412, and 417 include elongated arrays in thermal contact with said phase plane heat pipes. As shown herein, an angle between 0 and 90 degrees is suggested relative to the angulated portion of the phase plane heat pipe extending laterally outwardly from element 426, which may be a heat source or a third thermally conductive spacer block disposed beneath the first phase plane heat pipe 401 with a heat generating component 420 disposed therebeneath (as shown in FIG. 9). The heat source 420 may be any of a plurality of heat generating components, such as computer chips and/or elements within an electrical circuit. As also referenced in FIG. 9, the type of material, either copper or aluminum, has been specified on the thermally conductive spacer blocks 422, 424, and 426. The thermally conductive spacer blocks 422, 424, and 426 provide a conduit for heat transfer from the heat generating component 420 up to and through the stacked, low profile cooling system of the present invention.

Figure 10:
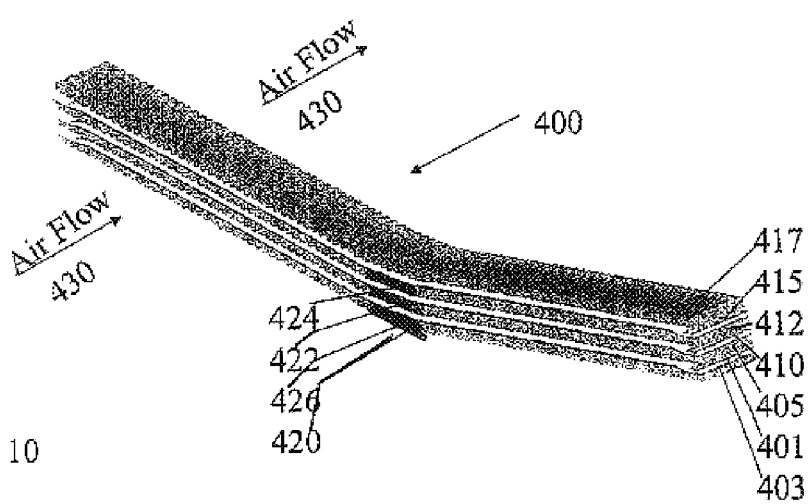
FIG. 10 is a perspective view of an embodiment of the stacked, low profile cooling system of the present invention.

Referring now to FIG. 10, there is shown a perspective view of the stacked, low profile cooling system 400 of FIG. 9. In this particular embodiment, air flow is in the direction of arrow 430. Air is permitted to flow around and through the fins 417, 412, 405, and 403 to provide the cooling of the surfaces of the phase plane heat pipes 401, 410, and 415 in accordance with the principles of the present invention. In this way the stacked, low profile cooling system 400 provides improved operational efficiencies.

Figure 11:
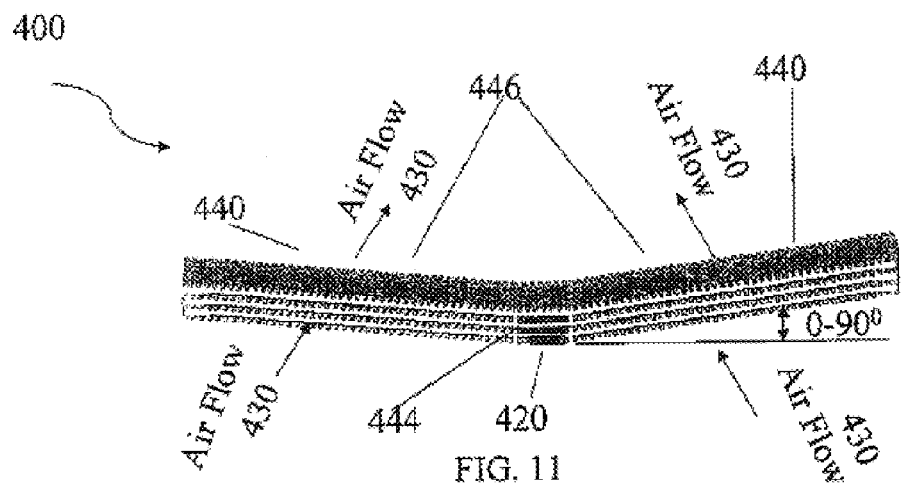
FIG. 11 is a side view of an embodiment of the stacked, low profile cooling system of the present invention.

Referring now to FIG. 11, there is shown a side view of the stacked, low profile cooling system 400 constructed in accordance with the principles of the present invention. The stacked, low profile cooling system 400, as described above, includes a condenser section 440 where condensing occurs. Likewise, an evaporator section 444 is illustrated in a generally centrally disposed area of the stacked, low profile cooling system 400 wherein heat is absorbed from the heat source 420. The absorption of the heat by the stacked, low profile cooling system 400 of the present invention causes evaporation and the movement of the fluid within the phase plane heat pipes 401, 410, and 415 through adiabatic sections 446 wherein the fluid is allowed to expand without either loss or gain of heat, as is the technical definition of adiabatic. The angle of 0 to 90 degrees as shown herein further facilitates the movement of the evaporated fluid into the extremities of the heat pipes for the condensation thereof in the condenser sections 440, and the flow of fluid back through the adiabatic sections 446 and into the evaporator section 444 where additional heat may be absorbed.

Referring now to FIGS. 9, 10, and 11, the stacked, low profile cooling system 400 of the present invention illustrates phase plane heat pipes in an innovative manner providing a low profile and lightweight cooling alternative to conventional heat sinks. The low profile and flat phase plane heat pipes provide an ideal surface to attach to a heat generating component and fins to cool the component. Through the stacking of phase planes, heat removal rates of over 100 watts can be achieved for a standard 31×31 mm microprocessor, or keep lower wattage microprocessors at a lower operating temperature.

Referring still to FIGS. 9, 10 and 11 in combination, there is shown the stacks of the phase plane heat pipes 401, 410, and 415 that provide a low profile, high watt density heat removal design. The materials of construction preferably include copper, aluminum, or other thermally conductive substances. This is particularly true of the thermally conductive spacer blocks 422, 424, and 426 above described and secured to the heat generating component 420 (as shown in FIG. 9). The attachment process can be done through mechanically compressing the heat generating device to the heat sink with a thermal pad or thermal grease therebetween. The specific mounting mechanism is not shown herein and can include a variety of methods currently used in the heat sink market place. The base stack that is in contact with the heat generating component may also be the phase plane heat pipe as well. The fins 403, 405, 412, and 417 can be attached on both sides of the phase plane heat pipes 401, 410, and 415 providing surface area for the air/heat exchange to reduce the temperature of the cooling system 400 of FIGS. 9–11, and thus the heat generating component 420. Air is ducted across the cooling fins 403, 405, 412, and 417 and the heat pipes 401, 410, and 415 in the manner shown in FIGS. 9–11.

Again referring to the operation of the stacked, low profile cooling system 400 of the present invention, the evaporator section 444 comprise that region of the phase plane heat pipes where the heat generating component 420 is positioned, as best illustrated in FIG. 11. The condenser sections 440 of the phase plane heat pipes located toward the ends thereof provide for the recirculation of the fluid therein and through the adioabatic sections 446. Significant increases in performance are provided when gravity aids the operation of the individual phase plane heat pipes. The design can have an angular range from 0 degrees (horizontal) to 90 degrees (vertical), depending on the design parameters required for a particular device. Through the stacking approach and increased effective fin-surface area, the stacked, low profile cooling system of the present invention will provide superior performance in a low profile package.

Figure 12:
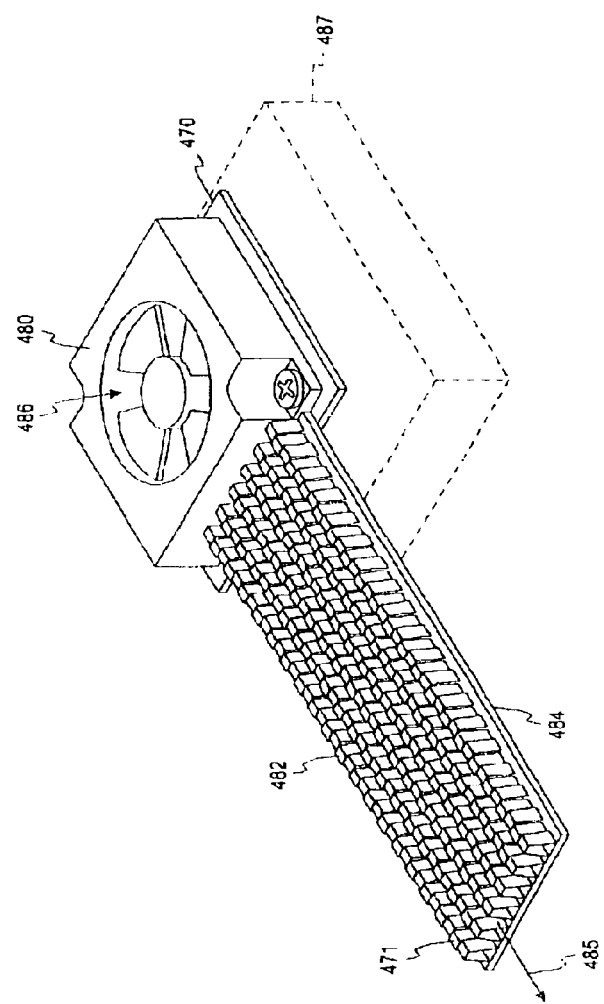
FIG. 12 is an embodiment of a cooling system illustrating various aspects of the operation thereof in accordance with the principles of the present invention.

Referring now to FIG. 12, there is shown an alternative embodiment of the stacked, low profile cooling system of the present invention incorporating a possible design for a laptop computer. A heat generating component 487 is shown in phantom and may comprise a printed circuit board disposed in a laptop computer. In this particular embodiment, air is sucked into a fan 480 as shown by arrow 486. As shown by arrow 485, air is blown out the sides through fin stock 482 mounted upon at least one phase plane heat pipe 484 of the type set forth and described in FIGS. 9–11. The evaporator section 470 of the phase plane heat pipe 484 is thermally and mechanically affixed to the heat generating component 487. The fins 482 are placed on the condenser section 471 to aid in the cooling thereof. A 0 degrees to 90 degrees orientation may be placed on the phase plane 484 between the evaporator section 470 and the condenser section 471. In another embodiment, a stacked array of heat pipes may be utilized in accordance with the stacked, low profile cooling system of the present invention, as well as the utilization of a phase plane heat pipe on both sides of the fan 480.

Figure 13:
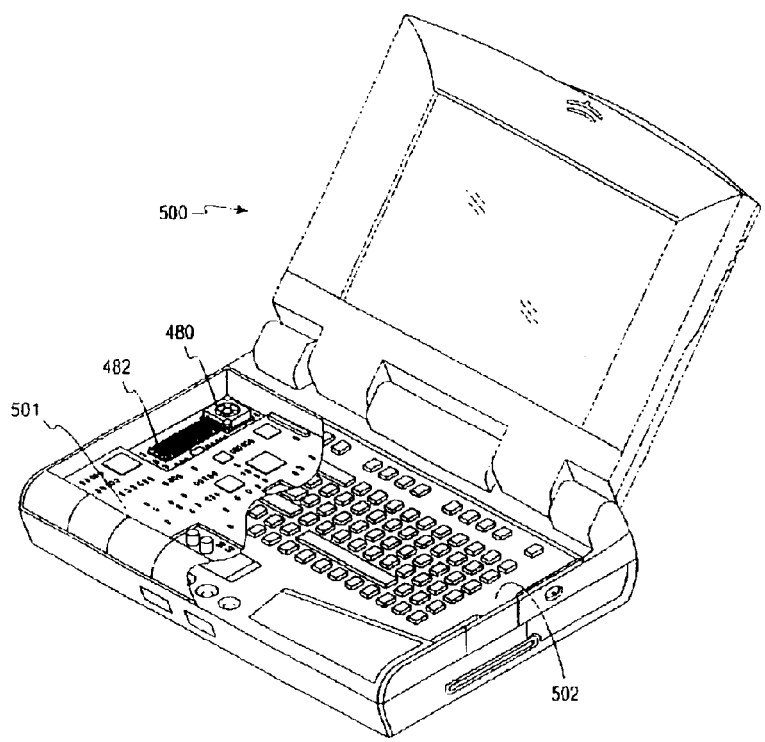
FIG. 13 is an illustration of a laptop computer including an embodiment of the present invention.

Referring now to FIG. 13, a laptop computer 500 including an embodiment of the present invention, as shown in FIG. 12, is described. The fan 480 is disposed in a corner beneath a keyboard 502 and above a heat source 501 such as a circuit board. Air is drawn in to the fan 480 and dispersed outward through the fin stock 482. Although the fin stock 482 is illustrated as being positioned vertically in the laptop, the fin stock 482 may also be positioned in other orientations, such as horizontally.

Figure 14:
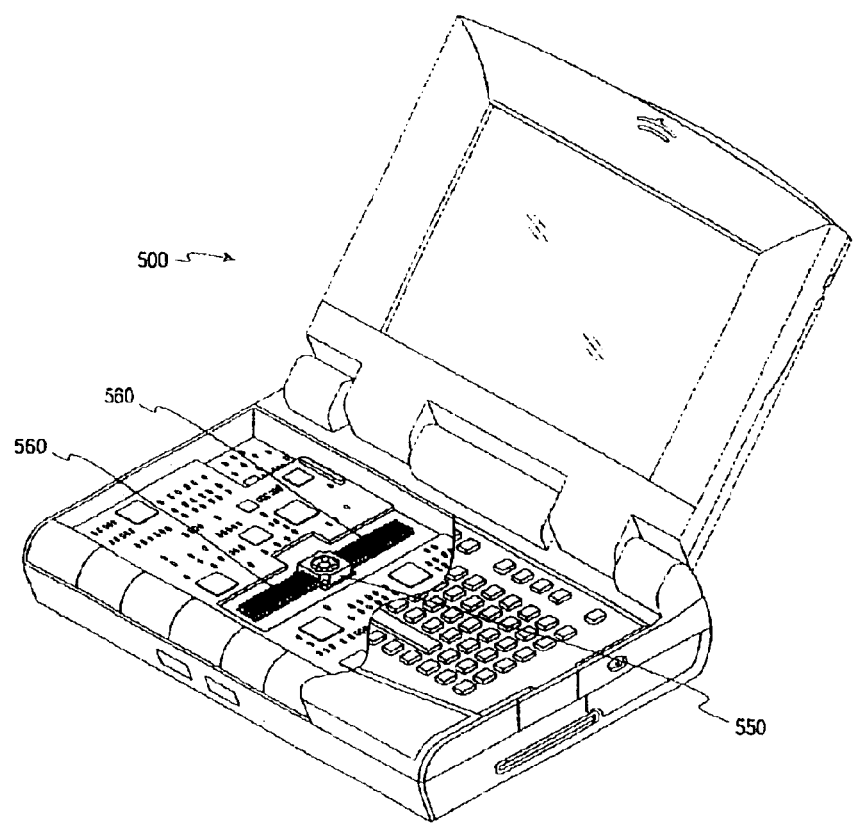
FIG. 14 is an illustration of a laptop computer including an alternate embodiment of the present invention.

Referring now to FIG. 14, there is shown an alternate embodiment of the present invention disposed in a laptop computer 500. In this embodiment, a fan 550 is connected with two fin stocks 560 for dispersing heat. The fan 550 may be located anywhere within the laptop 500 and have one or more fin stocks 560 associated with the fan 550. The fin stocks 560 may be located at opposite sides of the fan 550, or form an L-shape. The fan 550 may also have more than two fin stocks 560 associated therewith.

Various embodiments of the stacked, low profile cooling system of the present invention may also include cross configurations where the phase plane heat pipes extend orthogonally one to the other and/or at angles acute to each other for purposes of positioning around components within an electrical system, such as a computer, and/or to improve air flow there across to improve the thermal efficiency thereof.

It is believed that the operation and construction of the present invention will be apparent from the foregoing description of a preferred embodiment. While the device shown is described as being preferred, it will be obvious to a person of ordinary skill in the art that various changes and modifications may be made therein without departing from the spirit and scope of the invention as defined in the following claims. Therefore, the spirit and the scope of the appended claims should not be limited to the description of the preferred embodiments contained herein.

What is claimed is:

1. A cooling system for removing heat from at least one heat generating component, said cooling system comprising:
   a first low profile phase plane heat pipe having a surface adapted for receiving heat from the at least one heat generating component and having a plurality of micro tubes disposed therein;
   a heat transfer fluid contained within said plurality of micro tubes;
   at least a second low profile phase plane heat pipe mounted to said first heat pipe in thermal contact therewith for receiving heat therefrom; and
   a thermally conductive spacer block in thermal contact with the undersurface of said first heat pipe, and said at least a second heat pipe, such that said thermally conductive spacer block provides thermal contact between said at least one heat generating component and said first heat pipe, and between said at least a second heat pipe and said first heat pipe.

2. The cooling system of claim 1, wherein said first and at least a second heat pipes are each formed from a single piece, and are substantially rectangular in shape.

3. The cooling system of claim 1, wherein said first and at least a second heat pipes are plated on an exterior surface with a metal material.

4. The cooling system of claim 1, wherein said at least a second heat pipe extends in parallel to said first heat pipe.

5. The cooling system of claim 1, wherein said at least a second heat pipe extends at an angle acute to said first heat pipe.

6. The cooling system of claim 1, wherein said thermally conductive spacer block is formed of a metal material.

7. The cooling system of claim 6, wherein said metal material is selected from a group consisting of copper and aluminum.

8. The cooling system of claim 1, further comprising an array of cooling fins in thermal contact with the topside and underside exterior of said first and said at least a second heat pipe.

9. The cooling system of claim 1, wherein said first heat pipe comprises a first portion in thermal contact with said at least one heat generating component, and at least one second portion, and said at least a second heat pipe comprises a first portion in thermal contact with said first portion of said first heat pipe, and at least one second portion.

10. The cooling system of claim 1, wherein said at least one second portion is raised relative to said first portion at an angle between 0 and 90 degrees.

11. The cooling system of claim 1, wherein said heat transfer fluid removes heat from the at least one heat generating component via an adiabatic process, wherein said heat transfer fluid is evaporated in said first portion and condensed in said at least one second portion to facilitate the removal of heat from the at least one heat generating component.

12. The cooling system of claim 1, wherein said plurality of micro tubes further comprise an internal wick structure to facilitate heat removal via capillary action.

13. The cooling system of claim 12, wherein said internal wick structure is selected from the group consisting of internal fins, grooved inner sidewalls, and metal screens.

14. The cooling system of claim 1, wherein said heat transfer fluid is selected from the group consisting of water, glycol, and alcohol.

15. The cooling system of claim 1, wherein said cooling system is affixed to a printed circuit board for cooling the at least one heat generating component, and said printed circuit board is affixed in a notebook computer, wherein said cooling system is configured to conform to the shape and size of said notebook computer.

16. The cooling system of claim 8, further comprising a fan, wherein air is sucked into said fan and blown out the sides of said fan through said array of cooling fins, wherein said fan increases the heat removal rate of said cooling system.

17. A cooling system for removing heat from at least one heat generating component, said cooling system comprising:
a plurality of low profile phase plane heat pipes disposed in thermal contact one with the other, having a surface adapted for receiving heat one from the other and from the at least one heat generating component, and each having a plurality of micro tubes disposed therein;
a heat transfer fluid contained within said plurality of micro tubes; and
a thermally conductive spacer block in thermal contact with the undersurface of said plurality of heat pipes, such that said thermally conductive spacer block provides thermal contact between the at least one heat generating component and said plurality of heat pipes, and between each of said plurality of heat pipes.

18. The cooling system of claim 17, wherein each of said plurality of heat pipes are each formed from a single piece and are substantially rectangular in shape.

19. The cooling system of claim 17, wherein each of said plurality of heat pipes are plated on an exterior surface with a metal material.

20. The cooling system of claim 17, wherein each of said plurality of heat pipes extend in parallel one to the other.

21. The cooling system of claim 17, wherein each of said plurality of heat pipes extend at an acute angle one to the other.

22. The cooling system of claim 17, wherein said thermally conductive spacer block is formed of a metal material.

23. The cooling system of claim 22, wherein said metal material is selected from a group consisting of copper and aluminum.

24. The cooling system of claim 17, further comprising an array of cooling fins in thermal contact with the topside and underside exterior of each of said plurality of heat pipes.

25. The cooling system of claim 17, wherein said plurality of heat pipes comprise a first portion in thermal contact with said heat generating component, and at least one second portion raised relative to said first portion.

26. The cooling system of claim 17, wherein said first portion is raised relative to said at least one second portion at an angle between 0 and 90 degrees.

27. The cooling system of claim 25, wherein said heat transfer fluid removes heat via an adiabatic process, and wherein said heat transfer fluid is evaporated in said first portion and condensed in said at least one second portion to facilitate the removal of heat.

28. The cooling system of claim 17, wherein each of said plurality of micro tubes further comprise an internal wick structure to facilitate heat removal via capillary action.

29. The cooling system of claim 28, wherein said internal wick structure is selected from the group consisting of internal fins, grooved inner sidewalls, and metal screens.

30. The cooling system of claim 17, wherein said heat transfer fluid is selected from the group consisting of water, glycol, and alcohol.

31. The cooling system of claim 17, wherein said cooling system is affixed to a printed circuit board for cooling the at least one heat generating component, and said printed circuit board is affixed in a notebook computer, wherein said cooling system is configured to conform to the shape and size of said notebook computer.

32. The cooling system of claim 24, further comprising a fan, wherein air is sucked into said fan and blown out the sides of said fan through said array of cooling fins, wherein said fan increases the heat removal rate of said cooling system.

33. A cooling system for removing heat from at least one heat generating component, said cooling system comprising:
a first phase plane heat pipe having a first portion in thermal contact with a thermally conductive spacer block receiving heat from the at least one heat generating component, said first portion having at least one second portion extending therefrom, and having a plurality of micro tubes;
a heat transfer fluid contained within said plurality of micro tubes, wherein said heat transfer fluid is evaporated in said first poprtion and condensed in said at least one second portion to facilitate the removal of heat; and at least a second low profile phase plane heat pipe having a first portion in thermal contact with a thermally conductive spacer block receiving heat from said first heat pipe, said first portion having at least one second portion extending therefrom, and having a plurality of micro tubes.

34. The cooling system of claim 33, wherein said first low profile phase plane heat pipe and said at least a second low profile phase plane heat pipe are each formed from a single piece, and are substantially rectangular in shape.

35. The cooling system of claim 33, wherein said at least a second heat pipe extends in parallel to said first low profile phase plane heat pipe.

36. The cooling system of claim 33, wherein said at least a second low profile phase plane heat pipe extends at an acute angle to said first low profile phase plane heat pipe.

37. The cooling system of claim 33, wherein said thermally conductive spacer block is formed of a metal material.

38. The cooling system of claim 37, wherein said metal material is selected from a group consisting of copper and aluminum.

39. The cooling system of claim 33, wherein said first and at least a second heat pipe further comprise an array of cooling fins in thermal contact with the topside and underside exterior of said first and at least a second low profile phase plane heat pipe.

40. The cooling system of claim 33, wherein said at least one second portion of said first and at least a second heat pipe is raised relative to said first portion of said first and at least a second heat pipe at an angle between 0 and 90 degrees.

41. The cooling system of claim 33, wherein said plurality of micro tubes internally comprise an internal wick structure to facilitate heat removal from the at least one heat generating component via capillary action.

42. The cooling system of claim 41, wherein said internal wick structure is selected from the group consisting of internal fins, grooved inner sidewalls, and metal screens.

43. The cooling system of claim 33, wherein said heat transfer fluid is selected from the group consisting of air, water, glycol, and alcohol.

44. The cooling system of claim 33, wherein said cooling system is affixed to a printed circuit board for cooling said at least one heat generating component, and said printed circuit board is affixed to a notebook computer, wherein said cooling system is configured to conform to the shape and size of said notebook computer.

45. The cooling system of claim 39, further comprising a fan, wherein air is sucked into said fan and blown out the sides of said fan through said array of cooling fins, wherein said fan increases the heat removal rate of said cooling system.

46. A method of removing heat from at least one heat generating component, comprising the steps of:
providing a plurality of phase plane heat pipes each having a plurality of micro tubes internally comprising a heat transfer fluid, and each having a first portion and at least one second portion;
stacking said first portions of said plurality of heat pipes in thermal contact one with the other to improve the thermal efficiency thereof;
securing said first portion of said plurality of heat pipes adjacent to said heat generating element;
securing a thermally conductive spacer to the underside of said first portions of said plurality of heat pipes.

47. The method according to claim 46, wherein the step of stacking further comprises the step of:
stacking said first portions of said plurality of heat pipes adjacent to the heat generating element.

48. The method according to claim 47, wherein the step of stacking further comprises the step of securing to the topside and underside of each of said plurality of heat pipes an array of fins.

49. The method according to claim 46, wherein the step of securing said plurality of heat pipes comprises the step of mechanically compressing said plurality of heat pipes to the at least one heat generating component with a thermal pad or grease therebetween.

50. The method according to claim 48, further comprising the step of blowing air over the array of fins of said plurality of heat pipes so as to facilitate the removal of heat from the at least one heat generating component.

51. The method according to claim 46, further comprising the step of raising said first portion relative to said at least one second portion at an angle between 0 and 90 degrees.

52. The method according to claim 46, wherein the step of providing further comprises providing a plurality of heat pipes each having a plurality of micro tubes internally comprising a heat transfer fluid, and each in parallel one with the other.

53. The method according to claim 46, wherein the step of providing further comprises providing a plurality of heat pipes each having a plurality of micro tubes internally comprising a heat transfer fluid, and each extending at an acute angle one to another.

54. A method of removing heat from at least one heat generating component, comprising the steps of:
providing a plurality of low profile phase plane heat pipes each having a plurality of micro tubes internally comprising a heat transfer fluid and wick structures, an array of fins attached to the topside and underside exterior of said plurality of low profile phase plane heat pipes, a first portion and at least one second portion raised at an angle between 0 and 90 degrees relative to said first portion;
securing a thermally conductive spacer to the underside of said first portions of said plurality of low profile phase plane heat pipes;
stacking said first portions of said plurality of low profile phase plane heat pipes adjacent to the heat generating component; and
removing heat from said heat transfer fluid via an adiabatic process and capillary action via said internal wick structures.

55. The method according to claim 54, wherein the step of securing said plurality of low profile phase plane heat pipes comprises the step of mechanically compressing said heat generating element to said plurality of low profile phase plane heat pipes with a thermal pad or grease therebetween.

56. The method according to claim 54, further comprising the step of blowing air over the array of fins on the topside and underside exterior of said plurality of low profile phase plane heat pipes.

57. The method according to claim 54, wherein the step of providing further comprises providing a plurality of heat pipes each in parallel one with the other.

58. The method according to claim 54, wherein the step of providing further comprises providing a plurality of heat pipes each extending at an acute angle one to another.

* * * * *

UNITED STATES PATENT AND TRADEMARK OFFICE
CERTIFICATE OF CORRECTION

| | |
|---|---|
| PATENT NO. | : 6,834,712 B2 |
| APPLICATION NO. | : 10/305662 |
| DATED | : December 28, 2004 |
| INVENTOR(S) | : Overton L. Parish et al. |

It is certified that error appears in the above-identified patent and that said Letters Patent is hereby corrected as shown below:

Column 2, line 50    Replace "invetnion"
    With --invention--

Column 14, line 66    Replace "poprtion"
Claim 33    With --portion"--

UNITED STATES PATENT AND TRADEMARK OFFICE
CERTIFICATE OF CORRECTION

| | |
|---|---|
| PATENT NO. | : 6,834,712 B2 |
| APPLICATION NO. | : 10/305662 |
| DATED | : December 28, 2004 |
| INVENTOR(S) | : Overton L. Parish et al. |

It is certified that error appears in the above-identified patent and that said Letters Patent is hereby corrected as shown below:

Column 16, Lines 31-50
Claim 54

Replace entire Claim 54 with the following text:

--54. A method of removing heat from at least one heat generating component, comprising the steps of:

providing a plurality of low profile phase plane heat pipes each having a plurality of micro tubes internally comprising a heat transfer fluid and wick structures, an array of fins attached to the topside and underside exterior of said plurality of low profile phase plane heat pipes, a first portion and at least one second portion raised at an angle between 0 and 90 degrees relative to said first portion;

securing a thermally conductive spacer to the underside of said first portions of said plurality of low profile phase plane heat pipes;

stacking said first portions of said plurality of low profile phase plane heat pipes in thermal contact one with the other to improve the thermal efficiency thereof;

securing said first portion of said plurality of low profile phase plane heat pipes adjacent to the heat generating component; and

UNITED STATES PATENT AND TRADEMARK OFFICE
CERTIFICATE OF CORRECTION

PATENT NO. : 6,834,712 B2
APPLICATION NO. : 10/305662
DATED : December 28, 2004
INVENTOR(S) : Overton L. Parish et al.

It is certified that error appears in the above-identified patent and that said Letters Patent is hereby corrected as shown below:

Removing heat from said heat transfer fluid via an adiabatic process and capillary action via said internal wick structures.--

Signed and Sealed this

Third Day of October, 2006

JON W. DUDAS
*Director of the United States Patent and Trademark Office*